United States Patent
Kammuri

(10) Patent No.: US 10,178,816 B2
(45) Date of Patent: Jan. 8, 2019

(54) COPPER FOIL COMPOSITE, COPPER FOIL USED FOR THE SAME, FORMED PRODUCT AND METHOD OF PRODUCING THE SAME

(75) Inventor: Kazuki Kammuri, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 537 days.

(21) Appl. No.: 14/115,803

(22) PCT Filed: May 8, 2012

(86) PCT No.: PCT/JP2012/061761
§ 371 (c)(1),
(2), (4) Date: Feb. 10, 2014

(87) PCT Pub. No.: WO2012/157469
PCT Pub. Date: Nov. 22, 2012

(65) Prior Publication Data
US 2014/0162084 A1    Jun. 12, 2014

(30) Foreign Application Priority Data

May 13, 2011   (JP) ................................. 2011-108298

(51) Int. Cl.
*B32B 15/01*   (2006.01)
*H05K 1/09*    (2006.01)
(Continued)

(52) U.S. Cl.
CPC ........... *H05K 9/0084* (2013.01); *B21D 33/00* (2013.01); *B32B 7/12* (2013.01); *B32B 15/01* (2013.01);
(Continued)

(58) Field of Classification Search
CPC ....................................................... B32B 15/01
(Continued)

(56) References Cited

U.S. PATENT DOCUMENTS

| 4,250,375 A | 2/1981 | Tsutsumi et al. |
| 4,522,880 A | 6/1985 | Klostermeier et al. |

(Continued)

FOREIGN PATENT DOCUMENTS

| EP | 0691389 | 1/1996 |
| EP | 2 100 987 | 9/2009 |

(Continued)

OTHER PUBLICATIONS

Japanese Industrial Standard JIS C2531.
(Continued)

*Primary Examiner* — Humera N Sheikh
*Assistant Examiner* — Xiaobei Wang
(74) *Attorney, Agent, or Firm* — Jenkins, Wilson, Taylor & Hunt, P.A.

(57) ABSTRACT

A copper foil composite comprising a copper foil and a resin layer laminated, the copper foil containing at least one selected from the group consisting of Sn, Mn, Cr, Zn, Zr, Mg, Ni, Si and Ag at a total of 30 to 500 mass ppm, a tensile strength of the copper foil having of 100 to 180 MPa, a degree of aggregation $I200/I_0 200$ of a (100) plane of the copper foil being 30 or more, and an average grain size viewed from a plate surface of the copper foil being 10 to 400 μm.

5 Claims, 1 Drawing Sheet

(51) Int. Cl.
  *B21D 33/00*  (2006.01)
  *C22F 1/08*  (2006.01)
  *C22C 9/00*  (2006.01)
  *B32B 15/20*  (2006.01)
  *B32B 15/08*  (2006.01)
  *H05K 9/00*  (2006.01)
  *C22C 9/02*  (2006.01)
  *C22C 9/04*  (2006.01)
  *B32B 27/28*  (2006.01)
  *B32B 27/32*  (2006.01)
  *B32B 7/12*  (2006.01)
  *B32B 27/00*  (2006.01)

(52) U.S. Cl.
  CPC .............. *B32B 15/08* (2013.01); *B32B 15/20* (2013.01); *B32B 27/281* (2013.01); *B32B 27/32* (2013.01); *C22C 9/00* (2013.01); *C22C 9/02* (2013.01); *C22C 9/04* (2013.01); *C22F 1/08* (2013.01); *H05K 1/09* (2013.01); *B32B 2255/06* (2013.01); *B32B 2307/208* (2013.01); *B32B 2307/212* (2013.01); *B32B 2307/546* (2013.01); *B32B 2457/00* (2013.01); *B32B 2457/20* (2013.01); *H05K 2201/0355* (2013.01); *H05K 2201/0358* (2013.01); *Y10T 29/30* (2015.01); *Y10T 428/12431* (2015.01); *Y10T 428/31678* (2015.04)

(58) Field of Classification Search
  USPC ........................................................ 428/606
  See application file for complete search history.

(56) References Cited

U.S. PATENT DOCUMENTS

| | | | |
|---|---|---|---|
| 4,675,246 | A | 6/1987 | Kundinger et al. |
| 4,749,625 | A | 6/1988 | Obayashi et al. |
| 4,965,408 | A | 10/1990 | Chapman et al. |
| 5,573,857 | A | 11/1996 | Auger |
| 5,645,921 | A | 7/1997 | Matsunaga et al. |
| 6,143,399 | A | 11/2000 | Kohno |
| 6,217,996 | B1 | 4/2001 | Yamamoto et al. |
| 6,251,507 | B1 | 6/2001 | Yamamoto et al. |
| 6,548,180 | B2 | 4/2003 | Yamamoto |
| 6,808,825 | B2 | 10/2004 | Nagai et al. |
| 6,835,442 | B2 | 12/2004 | Kudo et al. |
| 7,308,752 | B2 | 12/2007 | Tanaka |
| 8,053,082 | B2 | 11/2011 | Hashimoto |
| 8,557,392 | B2 | 10/2013 | Fujisawa et al. |
| 9,079,378 | B2 | 7/2015 | Kammuri |
| 9,549,471 | B2 | 1/2017 | Kammuri |
| 9,955,574 | B2 | 4/2018 | Tanaka et al. |
| 9,981,450 | B2 | 5/2018 | Tanaka et al. |
| 2002/0155021 | A1 | 10/2002 | Nagai et al. |
| 2003/0132192 | A1 | 7/2003 | Kudo et al. |
| 2004/0074655 | A1 | 4/2004 | Takahashi et al. |
| 2004/0094512 | A1 | 5/2004 | Ono et al. |
| 2007/0098910 | A1 | 5/2007 | Yamagata et al. |
| 2007/0102192 | A1 | 5/2007 | Naito et al. |
| 2008/0099110 | A1* | 5/2008 | Muroga et al. ................ 148/684 |
| 2009/0142607 | A1 | 6/2009 | Narui et al. |
| 2010/0269959 | A1* | 10/2010 | Gao et al. ..................... 148/554 |
| 2011/0005812 | A1 | 1/2011 | Shimokawa |
| 2011/0132643 | A1* | 6/2011 | Hattori ................ C22F 1/08 174/254 |
| 2011/0189501 | A1 | 8/2011 | Fujisawa et al. |
| 2012/0090887 | A1 | 4/2012 | Kanmuri |
| 2012/0107637 | A1 | 5/2012 | Akase |
| 2012/0141809 | A1* | 6/2012 | Kanmuri ....................... 428/457 |
| 2013/0056258 | A1 | 3/2013 | Zhang et al. |
| 2013/0071676 | A1 | 3/2013 | Kammuri |
| 2013/0206471 | A1 | 8/2013 | Kammuri |
| 2014/0113121 | A1 | 4/2014 | Kammuri |
| 2015/0064493 | A1 | 3/2015 | Tanaka et al. |
| 2015/0111059 | A1 | 4/2015 | Tanaka et al. |

FOREIGN PATENT DOCUMENTS

| | | |
|---|---|---|
| EP | 2 295 489 | 3/2011 |
| EP | 2 679 384 | 5/2015 |
| JP | 59-162044 | 9/1984 |
| JP | 1-163059 | 6/1989 |
| JP | 2-097097 | 4/1990 |
| JP | H03-112643 | 5/1991 |
| JP | 04-144187 | 5/1992 |
| JP | 04-223006 | 8/1992 |
| JP | 05-283883 | 10/1993 |
| JP | Hei7-003237 | 1/1995 |
| JP | 07-058477 | 3/1995 |
| JP | H7-101007 | 4/1995 |
| JP | HEI 07-032307 | 4/1995 |
| JP | Hei7-290449 | 11/1995 |
| JP | 1997-053162 | 2/1997 |
| JP | 09-270593 | 10/1997 |
| JP | 10-056289 | 2/1998 |
| JP | H10-058593 | 3/1998 |
| JP | 10-173385 | 6/1998 |
| JP | H11-40980 | 2/1999 |
| JP | 2009383 | 2/2000 |
| JP | 2000-101004 | 4/2000 |
| JP | 2000-182623 | 6/2000 |
| JP | 2000-212661 | 8/2000 |
| JP | 2001-011684 | 1/2001 |
| JP | 2002-019023 | 1/2002 |
| JP | 2002-144510 | 5/2002 |
| JP | 2002-217507 | 8/2002 |
| JP | 2002-249835 | 9/2002 |
| JP | 2002-319319 | 10/2002 |
| JP | 2003-096529 | 4/2003 |
| JP | 2003-193211 | 7/2003 |
| JP | 2004-060018 | 2/2004 |
| JP | 2004-256832 | 9/2004 |
| JP | 2004-360029 | 12/2004 |
| JP | 2005-004826 | 1/2005 |
| JP | 2005-015861 | 1/2005 |
| JP | 2005-068484 | 3/2005 |
| JP | 2005-191443 | 7/2005 |
| JP | 2005-248221 | 9/2005 |
| JP | 2005-344207 | 12/2005 |
| JP | 2006-240073 | 9/2006 |
| JP | 2006-272743 | 10/2006 |
| JP | 2006-324546 | 11/2006 |
| JP | 2006-326684 | 12/2006 |
| JP | 2007-110010 | 4/2007 |
| JP | 2007-146258 | 6/2007 |
| JP | 2007-207812 | 8/2007 |
| JP | 2008-088492 | 4/2008 |
| JP | 2008-120081 | 5/2008 |
| JP | 2008-166655 | 7/2008 |
| JP | 2009-108376 | 5/2009 |
| JP | 2009-111203 | 5/2009 |
| JP | 2009-161068 | 7/2009 |
| JP | 2010-006071 | 1/2010 |
| JP | 2010-37654 | 2/2010 |
| JP | 2010-100887 | 5/2010 |
| JP | 2010-194759 | 9/2010 |
| JP | 2011-20264 | 2/2011 |
| JP | 2011-152593 A | 8/2011 |
| JP | 5127086 | 1/2013 |
| JP | 5705311 | 4/2015 |
| RU | 95110689 | 3/1997 |
| RU | 2138932 | 9/1999 |
| RU | 2303320 | 7/2007 |
| RU | 2574461 | 2/2016 |
| SU | 994306 | 2/1983 |
| WO | WO 97/04627 | 2/1997 |
| WO | WO2004/016060 | 2/2004 |
| WO | WO 2004/035303 | 4/2004 |
| WO | WO 2008/050584 | 5/2008 |
| WO | WO 2009/144973 | 12/2009 |
| WO | WO2010/113343 | 10/2010 |

(56) References Cited

FOREIGN PATENT DOCUMENTS

| WO | WO 2011/004664 | * | 1/2011 | ............ B32B 15/08 |
|---|---|---|---|---|
| WO | WO2011/004664 | | 1/2011 | |
| WO | WO 2011/121801 | | 10/2011 | |
| WO | WO 2012/008260 | | 1/2012 | |
| WO | WO2012/132814 | | 10/2012 | |
| WO | WO2012/157469 | | 11/2012 | |
| WO | WO 2013/105265 | | 7/2013 | |
| WO | WO 2013/105266 | | 7/2013 | |

OTHER PUBLICATIONS

Japanese Industrial Standard JIS G3141.
Japanese Industrial Standard JIS H 3110.
Japanese Industrial Standard JIS H 4000.
Japanese Industrial Standard JIS H4551.
Japanese Industrial Standard JIS Z 2248.
Japanese Industrial Standard JIS-H0501.
Japanese Industrial Standard JIS-H3100.
Japanese Industrial Standard JIS-H3250.
Japanese Industrial Standard JIS-H3510.
Supplementary European Search Report corresponding to Application No. 12763155.4-1308 dated Jul. 10, 2014.
Japanese Industrial Standard JIS C5016.
Japanese Industrial Standard JIS Z2241.
Extended European Search Report corresponding to Application No. 12786287.8-1303 dated Oct. 16, 2014.
International Search Report corresponding to International Patent Application No. PCT/JP2012/050590 dated Apr. 17, 2012.
International Search Report corresponding to International Patent Application No. PCT/JP2012/050591 dated Apr. 17, 2012.
Notification of Transmittal of Translation of the International Preliminary Report on Patentability (Chapter I or Chapter II of the Patent Cooperation Treaty) corresponding to International Patent Application No. PCT/JP2012/050590 dated Jul. 24, 2014.
Notification of Transmittal of Translation of the International Preliminary Report on Patentability (Chapter I or Chapter II of the Patent Cooperation Treaty) corresponding to International Patent Application No. PCT/JP2012/050591 dated Jul. 24, 2014.
International Search Report corresponding to International Patent Application No. PCT/JP2012/055933 dated May 22, 2012.
International Search Report corresponding to International Patent Application No. PCT/JP2012/061761 dated Jul. 10, 2012.
Notification Concerning Transmittal of International Preliminary Report on Patentibility (Chapter I of the Patent Cooperation Treaty) corresponding to International Patent Application No. PCT/JP2012/055933 dated Oct. 8, 2013.
Notification of Transmittal of Translation of the International Preliminary Report on Patentability (Chapter I or Chapter II of the Patent Cooperation Treaty) corresponding to International Patent Application No. PCT/JP2012/061761 dated Nov. 19, 2013.
"Beam Deflection Formulae," pp. 1-2, 2013—<http://www.advancepipeliner.com/resources/others/beams/beam_deflection_formulae.pdf>.
Advisory Action corresponding to U.S. Appl. No. 13/382,360 dated Mar. 11, 2015.
Advisory Action corresponding to U.S. Appl. No. 13/254,385 dated Jun. 27, 2014.
Advisory Action corresponding to U.S. Appl. No. 13/579,073 dated Nov. 13, 2014.
Advisory Action corresponding to U.S. Appl. No. 13/579,073 dated May 18, 2016.
Arruda et al, "Effects of strain rate, temperature and thermomechanical coupling on the finite strain deformation of glassy polymers", Mechanics of Materials 19 (1995) pp. 193-212.
Asaharu, N., "Member and Metho for Electromagnetically Shielding Electric Wires, or the like". Jun. 26, 1998, pp. 1-4 (JP10-1973385 A), [Drawings], <http://www4.ipdl.inpit.go.jp/Tokujitu/PAJdetail.ipdl?N0000=60&N0120=01 &N2001=2&N3001=H10-173385>.
Asaharu, N., "Member and Metho for Electromagnetically Shielding Electric Wires, or the like". Jun. 26, 1998, pp. 1-6 (JP10-173385 A), [Translation of—Detailed Description], <http://www4.ipdl.inpit.go.jp/Tokujitu/PAJdetail.ipdl?N0000=60& N0120=01&N2001=2 &N3001=H10-173385>.
Autograph AGS-X Series Precision Universal Tester, Shamadzu Corporation, pp. 1-2, marketing material printed from web site www.shimadzu.com on Mar. 22, 2014.
BASF Corporation, "Tensile Properties of Semi-Crystalline Thermoplastics—Performance Comparison under Alternative Testing Standard", Paper No. 2000-01-1319, pp. 1-14, 2003.
English translation of Decision to Grant Russian Patent Application No. 2014128526 dated Oct. 29, 2015.
International Preliminary Report on Patentability corresponding to International Application No. PCT/JP2009/067886 dated Nov. 15, 2011.
International Search Report corresponding to International Patent Application No. PCT/JP2009/067886 dated Dec. 8, 2009.
International Search Report corresponding to International Patent Application No. PCT/JP2010/059416 dated Aug. 3, 2010 (Translation).
International Search Report corresponding to International Patent Application No. PCT/JP2010/058975 dated Aug. 31, 2010 (Translation).
International Search Report corresponding to International Patent Application No. PCT/JP2011/063770 dated Aug. 23, 2011 (Translation).
Interview Summary corresponding to U.S. Appl. No. 13/579,073 dated Sep. 25, 2014.
Interview Summary corresponding to U.S. Appl. No. 13/254,385 dated Dec. 16, 2014.
Interview Summary corresponding to U.S. Appl. No. 13/520,087 dated Mar. 15, 2016.
Japanese Industrial Standard C2151, "Testing methods of plastic films for electrical purposes," (2006).
Japanese Industrial Standard JIS K 7127, "Plastics—Determination of tensile properties—Part 3: Test conditions for films and sheets," Japanese Standards Association (1999) (Translation).
Japanese Industrial Standard JIS Z2201, "Test piece for tensile test for metallic materia,l" Japanese Standards Association (1998) (Translation).
Japanese Industrial Standard JIS Z 2241, "Metalic material—Tensile testing-Method of test at room temperature," Japanese Standards Association (2011).
"Materials Data Book", Cambridge University Engineering Department, pp. 1-37 (2003).
MCXS Photovoltaic CVD, Shamadzu Corporation, p. 1, marketing material printed from web site www.shimadzu.com on Mar. 24, 2014.
Notice of Allowance corresponding to U.S. Appl. No. 13/254,385 dated Apr. 6, 2015.
Notice of Allowance and Fee(s) Due for U.S. Appl. No. 13/579,073 dated Sep. 12, 2016).
Notice of Grant corresponding to Russian Patent Application No. 2014128572 dated Aug. 19, 2015.
Notification of Transmittal of Translation of the International Preliminary Report on Patentability corresponding to International Patent Application No. PCT/JP2010/059416 dated Feb. 23, 2012.
Notification of Transmittal of Translation of the International Preliminary Report on Patentability corresponding to International Patent Application No. PCT/JP2010/058975 dated Dec. 13, 2012.
Notification of Transmittal of Translation of the International Preliminary Report on Patentability (Chapter I or Chapter II of the Patent Cooperation Treaty) corresponding to International Patent Application No. PCT/JP2011/063770 dated Feb. 21, 2013.
Official Action corresponding to European Patent Application No. 11806591.1-1803 dated May 2, 2014.
Official Action corresponding to U.S. Appl. No. 13/254,385 dated May 23, 2013.
Official Action corresponding to U.S. Appl. No. 13/254,385 dated Sep. 5, 2013.
Official Action corresponding to U.S. Appl. No. 13/254,385 dated Mar. 14, 2014.

(56) References Cited

OTHER PUBLICATIONS

Official Action corresponding to U.S. Appl. No. 13/254,385 dated Sep. 11, 2014.
Official Action corresponding to U.S. Appl. No. 13/382,360 dated Jul. 17, 2014.
Official Action corresponding to U.S. Appl. No. 13/382,360 dated Dec. 12, 2014.
Official Action corresponding to U.S. Appl. No. 13/579,073 dated Jan. 8, 2014.
Official Action corresponding to U.S. Appl. No. 13/579,073 dated Jun. 20, 2014.
Official Action corresponding to U.S. Appl. No. 13/579,073 dated Oct. 5, 2015.
Official Action corresponding to U.S. Appl. No. 13/520,087 dated Jun. 30, 2015.
Official Action corresponding to U.S. Appl. No. 13/520,087 dated Jan. 7, 2016.
Official Action corresponding to U.S. Appl. No. 13/382,360 dated Jul. 29, 2016.
Official Action corresponding to U.S. Appl. No. 13/382,360 dated Jan. 12, 2016.
Official Action corresponding to U.S. Appl. No. 13/579,073 dated Feb. 2, 2016.
Official Action corresponding to U.S. Appl. No. 14/006,242 dated Feb. 11, 2016.
Official Action corresponding to U.S. Appl. No. 14/006,242 dated Jul. 28, 2016.
Official Action corresponding to U.S. Appl. No. 13/520,087 dated Aug. 12, 2016.
Proszynski et al, "Measurement of stress as a function of temperature in Ag and Cu thin films", Optica Applicata, vol. XXXV, No. 3, 2005, pp. 517-522.
Restriction Requirement corresponding to U.S. Appl. No. 14/006,242 dated Nov. 16, 2015.
Supplementary European Search Report corresponding to European Patent Application No. 09 842 694.3-1303 / 2416639 dated Mar. 21, 2013.
Supplementary European Search Report corresponding to European Patent Application No. 10 796 975.0-1303 / 2439063 dated Apr. 4, 2013.
Supplementary European Search Report corresponding to European Patent Application No. 11806591.1-1803 / 2581220 dated Apr. 15, 2014.
Supplementary European Search Report corresponding to European Patent Application No. 10848975.8-1803 dated Oct. 13, 2014.
Supplementary European Search Report corresponding to European Patent Application No. 12865468.8-1803 dated Jul. 16, 2015.
Supplementary European Search Report corrsponding to European Patent Application No. 12865150.2-1303 dated Aug. 14, 2015.
Translation of table 1 of JPA2002-19023("Kawazu"), p. 1 (2002).
Trapezium Lite X data processing reference manual, No. 349-05245A, pp. 1, and 45-46 (2014).
Trapezium Lite X, Shamadzu Corporation, p. 1, marketing material printed from web site www.shimadzu.com on Mar. 22, 2014.
Office Action corresponding to U.S. Appl. No. 13/520,087 dated Sep. 28, 2017.
Office Action corresponding to U.S. Appl. No. 14/369,909 dated Sep. 5, 2017.
Office Action corresponding to U.S. Appl. No. 14/369,891 dated Sep. 6, 2017.
Notice of Allowance and Fee(s) Due for U.S. Appl. No. 14/369,909 dated Jan. 17, 2018.
Notice of Allowance and Fee(s) Due for U.S. Appl. No. 14/369,891 dated Jan. 30, 2018.
Advisory Action corresponding to U.S. Appl. No. 13/520,087 dated Jul. 5, 2017.
Restriction Requirement corresponding to U.S. Appl. No. 14/369,891 dated Jun. 9, 2017.
Restriction Requirement corresponding to U.S. Appl. No. 14/369,909 dated Jun. 12, 2017.
Corrected Notice of Allowance and Fee(s) Due for U.S. Appl. No. 14/369,891 dated Apr. 19, 2018.
Notice of Allowance and Fee(s) Due for U.S. Appl. No. 14/369,909 dated Feb. 9, 2018.
Advisory Action corresponding to U.S. Appl. No. 13/382,360 dated Mar. 6, 2017.
Official Action corresponding to U.S. Appl. No. 13/520,087 dated Jan. 20, 2017.

\* cited by examiner

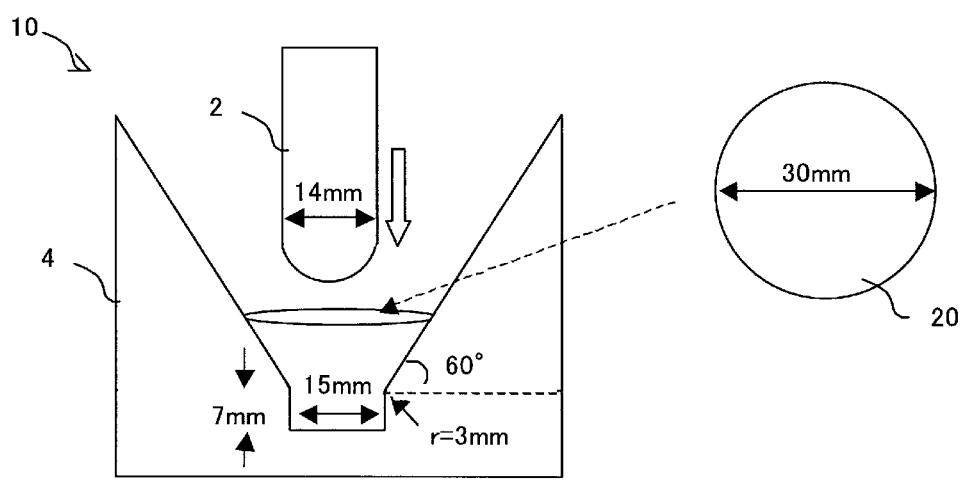

ns816 B2

COPPER FOIL COMPOSITE, COPPER FOIL USED FOR THE SAME, FORMED PRODUCT AND METHOD OF PRODUCING THE SAME

FIELD OF THE INVENTION

The present invention relates to a copper foil composite suitable for an electromagnetic shielding material, a copper laminate for FPC and a substrate to be heat dissipated, and a copper foil using the same.

DESCRIPTION OF THE RELATED ART

A copper foil composite comprising a copper foil and a resin film laminated thereon is used as an electromagnetic shielding material (see Patent Literature 1). The copper foil has electromagnetic shielding properties, and the resin film is laminated for reinforcing the copper foil. A method of laminating the resin film on the copper foil includes a method of laminating the resin film on the copper foil with an adhesive agent, and a method of vapor-depositing copper on the surface of the resin film. In order to ensure the electromagnetic shielding properties, the thickness of the copper foil should be several μm or more. Thus, a method of laminating the resin film on the copper foil is inexpensive.

In addition, the copper foil has excellent electromagnetic shielding properties. So, a material to be shielded is covered with the copper foil so that all surfaces of the material can be shielded. In contrast, if the material to be shielded is covered with a copper braid or the like, the material to be shielded is exposed at mesh parts of the copper braid, resulting in poor electromagnetic shielding properties.

Other than the electromagnetic shielding material, a composite of a copper foil and a resin film (PET, PI (polyimide), an LCP (liquid crystal polymer) and the like) is used for an FPC (flexible printed circuit). In particular, PI is mainly used for the FPC.

The FPC may be flexed or bent. The FPC having excellent flexibility has been developed and is used for a mobile phone (see Patent Literature 2). In general, the flex or bend in flexed parts of the FPC is a bending deformation in one direction, which is simple as compared with the deformation when the electromagnetic shielding material wound around electric wires is flexed. The formability of composite for the FPC is less required.

In contrast, the present applicant reports that the copper foil composite has improved elongation and formability, when there exists any relationship between thicknesses of the copper foil and the resin film and a stress of the copper foil under tensile strain of 4% (see Patent Literature 3).

PRIOR ART LITERATURE

Patent Literature

[Patent Literature 1] Japanese Unexamined Patent Publication No. Hei7-290449
[Patent Literature 2] Japanese Patent No. 3009383
[Patent Literature 3] International Publication WO 2011/004664

SUMMARY OF THE INVENTION

Problems to be Solved by the Invention

In recent years, a wide variety of mobile devices including a smartphone gets high functionality. Space-saving parts are needed for mounting on these devices. So, the FPC is folded into small pieces and incorporated into the devices, and the copper foil composite is required to have severe folding properties.

However, the copper foil composite having excellent bending properties is not yet well developed. For example, the technology described in Patent Literature 3 evaluates the formability of the copper foil composite by W bend test. There is no description about the configuration of the copper foil composite showing a good result in 180 degree intimate bend test for evaluating the severe bending properties.

Accordingly, an object of the present invention is to provide a copper foil composite having enhanced bending properties, and a copper foil using the same.

Means for Solving the Problems

The present inventors found that the bending properties can be enhanced by specifying composition, strength, a texture orientation, and a grain size in a copper foil of a copper foil composite. Thus, the present invention is attained.

That is, the present invention provides a copper foil composite comprising a copper foil and a resin layer laminated, the copper foil containing at least one selected from the group consisting of Sn, Mn, Cr, Zn, Zr, Mg, Ni, Si and Ag at a total of 30 to 500 mass ppm, a tensile strength of the copper foil having of 100 to 180 MPa, a degree of aggregation $I200/I_0 200$ of a (100) plane of the copper foil being 30 or more, and an average grain size viewed from a plate surface of the copper foil being 10 to 400 μm.

Preferably, the average grain size viewed from the plate surface of the copper foil is 50 to 400 μm.

Preferably, fracture strain of the copper foil being 5% or more, and $(F \times T)/(f \times t) \geq 1$ is satisfied, where t is a thickness of the copper foil, f is a stress of the copper foil under tensile strain of 4%, T is a thickness of the resin layer, and F is a stress of the resin layer under tensile strain of 4%.

Also, the present invention provides a copper foil, used for said copper foil composite.

Also, the present invention provides a formed product, provided by working said copper foil composite.

Also, the present invention provides a method of producing a formed product, comprising working said copper foil composite According to the present invention, there is provided a copper foil composite having enhanced bending properties.

BRIEF DESCRIPTION OF DRAWINGS

FIG. 1 shows a schematic configuration of a cup test device for evaluating the formability.

DETAILED DESCRIPTION OF THE INVENTION

The copper foil composite of the present invention comprises a copper foil and a resin layer laminated thereon.
<Copper Foil>
The copper foil may contain at least one selected from the group consisting of Sn, Mn, Cr, Zn, Zr, Mg, Ni, Si and Ag at a total of 30 to 500 mass ppm, and the rest being Cu and unavoidable impurities. The copper foil is a rolled copper foil.

Through studies by the present inventors, it is found that when the copper foil contains the above-described element (s), a {100} plane grows and the bending properties are improved as compared with pure copper. If the content of the above-mentioned element(s) is less than 30 mass ppm, the {100} plane does not grow and the bending properties are decreased. If the content exceeds 500 mass ppm, a shear band is formed upon rolling, the {100} plane does not grow, the bending properties are decreased and recrystallized grains may become non-uniform.

A plane orientation of the copper foil is described like "{100}", and an X-ray diffraction strength is described like "200".

As described above, a degree of aggregation $I200/I_0200$ ($I200$: the X-ray diffraction strength of the 200 plane of the copper foil, $I_0200$: the X-ray diffraction strength of the 200 plane of the copper powder) of the {100} plane of the copper foil is specified to be 30 or more. In this way, the orientation of crystal grains becomes uniform, and the deformation is easily transmitted beyond crystal grain boundaries. If the copper foil is thinned, the copper foil constricts locally beyond the crystal grains and the copper foil alone is not elongated. Accordingly, the copper foil alone may be easily elongated when the crystal grains are fine to some degree and the degree of aggregation is small. On the other hand, the copper composite provided by laminating the copper foil with the resin is affected by the deformation of the resin. Even if the crystal grains and the degree of aggregation of the copper foil alone are large, the copper foil is hardly constricted. Rather, when the crystal grains and the degree of aggregation of the copper foil are high, the copper foil will have low strength, easily follow the deformation of the resin, and have high ductility. As a result, the bending properties of the copper foil composite are improved.

The upper limit of the $I200/I_0200$ is not especially limited, but may be 120 or less, 110 or less, or 100 or less, for example.

A tensile strength of the copper foil is specified to be within 100 to 180 MPa. If the tensile strength of the copper foil is less than 100 MPa, the strength is too low to produce the copper foil composite. If the tensile strength of the copper foil exceeds 180 MPa, no {100} plane grows and the crystal grains become small as stacking fault energy of the texture is increased upon rolling.

An average grain size viewed from a plate surface of the copper foil is 10 to 400 µm. If the average grain size viewed from the plate surface of the copper foil is less than 10 µm, no {100} plane grows and the crystal grains become small as stacking fault energy of the texture is increased upon rolling. If the average grain size viewed from the plate surface of the copper foil exceeds 400 µm, it is difficult to produce the copper foil.

In particular, when the average grain size is within 50 to 400 µm, the bending properties and drawing formability are improved. If the average grain size exceeds 50 µm, the strength of the copper foil is decreased and the crystal grains becomes sufficiently larger than the thickness. Often, the respective crystal grains of the copper foil are directly contacted with the resin (the crystal grains not exposed to the surface of the copper foil are decreased), and the respective crystal grains are directly affected by the deformation of the resin. As a result, the bending properties of the copper foil composite may be improved. The drawing formability is necessary when the copper foil composite is press formed into a predetermined shape, for example.

The average grain size is an average value obtained by measuring grain sizes of the copper foil in a rolling direction and a direction transverse to rolling direction according to JIS H0501, the cutting method. As to a sample where a circuit is formed of the copper foil composite, the average grain size is an average value in a direction parallel to the circuit.

Fracture strain of the copper foil is desirably 5% or more. If the fracture strain is less than 5%, elongation of the copper foil composite may be decreased even if $(F \times T)/(f \times t) \geq 1$ of the copper foil composite is satisfied, as described later. If $(F \times T)/(f \times t) \geq 1$ is satisfied, the greater fracture strain of the copper foil is desirable.

When the copper foil is used for an electromagnetic shielding material, the thickness t of the copper foil is desirably 4 to 12 µm. If the thickness t is less than 4 µm, the shielding properties and the fracture strain are decreased and handling may be difficult when the copper foil is produced or laminated with the resin layer. On the other hand, the greater the thickness t is, the more the fracture strain is increased. However, if the thickness t exceeds 12 µm, stiffness may be increased to decrease the formability. If the thickness t exceeds 12 µm, $(F \times T)/(f \times t) \geq 1$ of the copper foil composite as described later is not satisfied and the fracture strain of the copper foil composite may be rather decreased. In particular, if the thickness t exceeds 12 µm, thickness T has to be increased to satisfy $(F \times T)/(f \times t) \geq 1$.

On the other hand, when the copper foil is used for FPC, or a substrate where heat dissipation is necessary, the thickness t of the copper foil is desirably 4 to 40 µm. As to the FPC, or the substrate where heat dissipation is necessary, no flexibility is necessary in the copper foil composite as compared with the case that the copper foil composite is used for the electromagnetic shielding material, a maximum value of the thickness t can be 40 µm. When PI is used as the resin layer, $(F \times T)/(f \times t) \geq 1$ can be satisfied even if the thickness t of the copper foil is thick, because the PI has high strength. The substrate to be heat dissipated is configured and used such that no circuit is formed on the copper foil in the FPC and the copper foil is intimately contacted with a heat dissipation body.

<Resin Layer>

The resin layer is not especially limited, and may be formed by applying a resin material to the copper foil. As the resin layer, a resin film that can be adhered to the copper foil is desirably used. Examples of the resin film include a PET (polyethylene terephthalate) film, a PI (polyimide) film, an LCP (liquid crystal polymer) film and a PP (polypropylene) film. In particular, the PI film is desirably used.

The thickness T of the resin layer is not especially limited, but is generally 7 to 25 µm for the electromagnetic shielding material. If the thickness T is less than 7 µm, a value of $(F \times T)$, which is described later, may be decreased, $(F \times T)/(f \times t) \geq 1$ is not satisfied, and the (elongation) fracture strain of the copper foil composite may be decreased. On the other hand, if the thickness T exceeds 25 µm, the (elongation) fracture strain of the copper foil composite may also be decreased.

The resin film may be laminated on the copper foil using an adhesive agent between the resin film and the copper foil, or may be thermally compressed to the copper foil without using an adhesive agent. In order to avoid excess heat, an adhesive agent is desirably used. The thickness of the adhesive layer is desirably 6 µm or less. If the thickness of the adhesive layer exceeds 6 µm, only the copper foil may be easily broken after the lamination of the copper foil composite.

On the other hand, when the copper foil is used for FPC, or a substrate where heat dissipation is necessary, the thickness T of the resin layer is generally about 7 to 70 µm. If the thickness T is less than 7 µm, the value of $(F \times T)/(f \times$ t)≥1, as described later, is decreased, (F×T)/(f×t)≥1 is not satisfied, and the (elongation) fracture strain of the copper foil composite may be decreased. On the other hand, if the thickness T exceeds 70 μm, the flexibility may be decreased.

The "resin layer" according to the present invention includes an adhesive layer. The FPC may have the resin layers on both surfaces of the copper foil by attaching a coverlay film. In this case, F and T of the resin layer include the strength and the thickness of the coverlay.

An Sn plating layer may be formed at a thickness of about 1 μm on a surface of the copper foil opposite to the surface on which the resin layer is formed, in order to improve corrosion resistance (salinity tolerance) or to decrease contact resistance.

In addition, a surface treatment such as a roughening treatment may be applied to the copper foil in order to improve the adhesion strength between the resin layer and the copper foil. As the surface treatment, those described in Japanese Unexamined Patent Publication No. 2002-217507, Japanese Unexamined Patent Publication No. 2005-15861, Japanese Unexamined Patent Publication No. 2005-4826, and Japanese Examined Patent Publication No. Hei7-32307 and the like can be applied.

By specifying the thickness or the strain of the copper foil and the resin layer in the copper foil composite, the drawing formability can be improved without impairing the formability.

In other words, it is found that when the copper foil composite satisfies (F×T)/(f×t) 1, where t is a thickness of the copper foil, f is a stress of the copper foil under tensile strain of 4%, T is a thickness of the resin layer, and F is a stress of the resin layer under tensile strain of 4%, the ductility is increased and the drawing formability is improved.

The reason is uncertain. However, as each of (F×T) and (f×t) represents the stress per unit width (for example, (N/mm)) and the copper foil and the resin layer are laminated to have the same width, (F×T)/(f×t) represents a ratio of strength added to the copper foil and the resin layer in the copper foil composite. Therefore, when the ratio is 1 or more, more strength is added on the resin layer and the resin layer will be stronger than the copper foil. It can be concluded that, since the copper foil may be easily affected by the resin layer and will be elongated uniformly, the ductility of the whole copper foil composite is increased.

Here, F and f may be the stresses at the same strain amount after plastic deformation is produced. In view of fracture strain of the copper foil and strain at a start of the plastic deformation of the resin layer (for example, the PET film), the stresses are at tensile strain of 4%. F can be measured by a tensile test of the copper foil remained after the resin layer is removed from the copper foil composite using a solvent etc. Similarly, f can be measured by a tensile test of the resin layer remained after the copper foil is removed from the copper foil composite using acid etc. T and t can be measured by observing a section of the copper foil composite using a variety of microscopes (SEM etc.).

If the values of F and f of the copper foil and the resin layer obtained before the copper foil composite is produced are known and if no heat treatment is conducted upon the production of the copper foil composite so that the properties of the copper foil and the resin layer are not greatly changed, the above-described known values of F and f obtained before the copper foil composite is produced may be used.

As described above, when (F×T)/(f×t)≥1 of the copper foil composite is satisfied, the ductility of the copper foil composite becomes high and the fracture strain is also improved. Desirably, when the fracture strain of the copper foil composite is 30% or more, after the copper foil composite is externally wound around a shielding material such as a cable to form a shielding material, cracks are less generated when the copper foil composite is bent accompanied by a cable drag.

The value of the fracture strain of the copper foil composite is provided by employing the strain when the copper foil and the resin layer are broken concurrently by a tensile test, or by employing the strain when only the copper foil is firstly cracked.

EXAMPLES

1. Copper Foil Composite

<Production of Copper Foil Composite>

Each ingot to which respective elements shown in Tables 1 to 3 were added to tough-pitch copper (JIS-H3100 (alloy No.: C1100)) was hot-rolled, or each ingot to which respective elements shown in Tables 4 were added to oxygen-free copper (JIS-H3100 (alloy No.: C1020)) was hot-rolled, surface grinded to remove oxides, cold-rolled, and annealed and acid picking repeatedly to a predetermined thickness. Cold-rolling at a thickness of 0.1 mm or less was conducted by heating copper was at 100 to 110° C., whereby the copper foil having formability was provided. In order to provide the copper foil with a uniform texture in a width direction, tension upon cold-rolling and rolling reduction conditions of the rolled material in a width direction were constant. A plurality of heaters was used to control the temperature so that a uniform temperature distribution during cold-rolling was attained in the width direction, and the temperature of the copper was measured and controlled.

In each of Examples and Comparative Examples 1 to 5, and Comparative Examples 14 to 17, the cold-rolling at a plate thickness of 0.1 mm or less was conducted by heating the copper foil at 100 to 110° C. Also, in each of Examples and Comparative Examples 1 to 5, and Comparative Examples 14 to 17, it was controlled that a rolling reduction ratio per one pass did not exceed 25% when the cold-rolling at a plate thickness of 0.1 mm or less was conducted.

On the other hand, in each of Comparative Examples 6 to 8, 10 to 13 and 18, upon the cold-rolling at a plate thickness of 0.1 mm or less the copper foil was not heated at 100 to 110° C. during rolling. Also, in each of Comparative Examples 6 to 8, 10 to 13 and 18, some of the rolling reduction ratio per one pass exceeded 25% when the cold-rolling at a plate thickness of 0.1 mm or less was conducted.

In Comparative Examples 19, the cold-rolling at a plate thickness of 0.1 mm or less was conducted by heating the copper foil at 100 to 110° C. during rolling, and some of the rolling reduction ratio per one pass exceeded 25% when the cold-rolling at a plate thickness of 0.1 mm or less was conducted.

In Comparative Example 20, upon the cold-rolling at a plate thickness of 0.1 mm or less the copper foil was not heated at 100 to 110° C. during rolling, and it was controlled that the rolling reduction ratio per one pass did not exceed 25% when the cold-rolling at a plate thickness of 0.1 mm or less was conducted.

In Comparative Example 9, an electrolyte copper foil was used.

A typical surface treatment used in CCL was conducted on the surface of the resultant copper foil. The surface treatment described in Japanese Examined Patent Publication No. Hei7-3237 was used. After the surface treatment, a PI layer, i.e., the resin layer, was laminated on the copper foil to produce a CCL (copper foil composite). The resin layer was laminated on the copper foil under the known conditions. When the PI layer was laminated on the copper foil, a thermoplastic PI base adhesive layer was interposed between the PI layer and the copper foil. The adhesive layer and the PI film constituted the resin layer.

<Tensile Test>

A plurality of strip test specimens each having a width of 12.7 mm were produced from the copper foil composites. Some strip test specimens were immersed in a solvent (TPE3000 manufactured by Toray Engineering Co., Ltd.,) to dissolve the adhesion layer and the PI film and to provide the test specimens each having only the copper foil. In some test specimens, the copper foils were dissolved with ferric chloride and the like to provide the test specimens of the only total layer having the PI.

The tensile test was conducted under the conditions that a gauge length was 100 mm and the tension speed was 10 mm/min. An average value of N10 was employed for strength (stress) and elongation.

<Aggregation Texture of Copper Foil I200/$I_0$200>

Each copper foil composite was immersed in a solvent (TPE3000 manufactured by Toray Engineering Co., Ltd.) to dissolve the adhesive layer and the PI film, thereby providing a test specimen composed of only the copper foil. Then, a value of integral (I) of the {100} plane strength on the rolled surface of the copper foil measured by the X-ray diffraction was determined. This values was divided by a value of integral ($I_0$) of the {100} plane strength of copper fine powder (325 mesh, used after heating at 300° C. under hydrogen stream for one hour) to calculate the I200/$I_0$200.

<Evaluation of Copper Foil Composite>
<W-Bending (Formability)>

According to Japan Copper and Brass Association, technical standard, JCBA T307, the copper foil composite was W-bended at bending radius R=0 mm. The W-bending is for evaluating formability of the general copper foil composite.

<180° Intimate Bending>

According to JIS Z 2248, the copper foil composite was tested for 180° intimate bending. The 180° intimate bending is stricter than the W-bending, and is for evaluating the bending properties of the copper foil composite. Next, the bent part at 180° was returned to 0°, and again bent at 180°. After 180° intimate bending were performed five times, the surfaces of the bent copper foils were observed.

<Drawing Formability>

The formability was evaluated using a cup test device 10 shown in FIG. 1. The cup test machine 10 comprised a die 4 and a punch 2. The die 4 had a frustum slope. The frustum was tapered from up to down. The frustum slope was tilted at an angle of 60° from a horizontal surface. The bottom of the frustum was communicated with a circular hole having a diameter of 15 mm and a depth of 7 mm. The punch 2 was a cylinder and had a tip in a semispherical shape with a diameter of 14 mm. The semispherical tip of the punch 2 could be inserted into the circular hole of the frustum.

A connection part of the tapered tip of the frustum and the circular hole at the bottom of the frustum was rounded by a radius (r)=3 mm.

The copper foil composite was punched out to provide the test specimen 20 in a circular plate shape with a diameter of 30 mm, and was disposed on the slope of the frustum of the die 4. The punch 2 was pushed down on the top of the test specimen 20 to insert it into the circular hole of the die 4. Thus, the test specimen 20 was formed in a conical cup shape.

In the case the resin layer was disposed on one surface of the copper foil composite, the copper foil composite was disposed on the die 4 such that the resin layer was faced upward. In the case the resin layers were disposed on both surfaces of the copper foil composite, the copper foil composite was disposed on the die 4 such that the resin layer bonded to the M surface was faced upward. In the case the both surfaces of the copper foil composite was Cu, either surface might be faced upward.

After molding, the crack of the copper foil in the test specimen 20 was visually identified. The formability was evaluated the following scales:

These copper foil composites were evaluated by the following scales:

Excellent: the copper foil was not cracked and had no necking.

Good: the copper foil had small wrinkles (necking) but had no large ones.

Not Bad: the copper foil had large necking, but was not cracked.

Bad: the copper foil was cracked.

As to the W-bending and the 180° intimate bending, Excellent and Good results are OK. As to the drawing formability, Excellent, Good and Not Bad results are OK.

The results are shown in Tables 1 to 3. In Tables, "TS" denotes tensile strength, "GS" denotes a grain size, and I/$I_0$ denotes the I200/$I_0$200. A method of measuring the GS is as described above. Specifically, the copper foil composite is immersed into the solvent (TPE3000 manufactured by Toray Engineering Co., Ltd.) to dissolve the adhesion layer and the PI film and to provide the test specimens each having only the copper foil. These copper foils were measured for GS.

TABLE 1

| | Copper foil | | | | | | Resin layer | | | | |
|---|---|---|---|---|---|---|---|---|---|---|---|
| | Added Element (wtppm) | TS (MPa) | f (MPa) | GS (μm) | 1/10 | Elongation (%) | t (μm) | type | TS (MPa) | F (MPa) | T (μm) | Elongation (%) |
| Example 1 | Ag: 200 | 115 | 110 | 95 | 55 | 4.5 | 9 | PI | 365 | 167 | 14 | 54 |
| Example 2 | Ag: 200 | 120 | 114 | 78 | 35 | 4.7 | 9 | PI | 365 | 167 | 14 | 54 |
| Example 3 | Ag: 50 | 101 | 96 | 135 | 70 | 4.5 | 12 | PI | 365 | 167 | 14 | 54 |
| Example 4 | Ag: 100 | 105 | 95 | 132 | 75 | 4.8 | 12 | PI | 365 | 167 | 14 | 54 |
| Example 5 | Ag: 200 | 125 | 110 | 110 | 80 | 5.8 | 12 | PI | 365 | 167 | 14 | 54 |
| Example 6 | Ag: 500 | 147 | 113 | 70 | 35 | 7.3 | 12 | PI | 365 | 167 | 14 | 54 |
| Example 7 | Sn: 50 | 110 | 105 | 130 | 63 | 4.5 | 12 | PI | 365 | 167 | 14 | 54 |
| Example 8 | Sn: 100 | 118 | 110 | 105 | 65 | 4.9 | 12 | PI | 365 | 167 | 14 | 54 |
| Example 9 | Sn: 170 | 148 | 118 | 80 | 58 | 6.5 | 12 | PI | 365 | 167 | 14 | 54 |
| Example 10 | Ag: 50, Sn: 50 | 120 | 110 | 128 | 69 | 5.1 | 12 | PI | 365 | 167 | 14 | 54 |

TABLE 1-continued

| | | | | | | | | | | | | |
|---|---|---|---|---|---|---|---|---|---|---|---|---|
| Example 12 | Zn: 100 | 172 | 125 | 20 | 40 | 8.3 | 12 | PI | 365 | 167 | 14 | 54 |
| Example 13 | Ag: 50 Zn: 50 | 122 | 108 | 55 | 55 | 5.1 | 12 | PI | 365 | 167 | 14 | 54 |
| Example 14 | Ag: 50 | 113 | 96 | 138 | 75 | 5.6 | 18 | PI | 365 | 167 | 14 | 54 |
| Example 15 | Ag: 100 | 113 | 100 | 142 | 83 | 5.1 | 18 | PI | 365 | 167 | 14 | 54 |
| Example 16 | Ag: 200 | 128 | 105 | 143 | 92 | 6.3 | 18 | PI | 365 | 167 | 14 | 54 |
| Example 17 | Ag: 200 | 110 | 90 | 370 | 96 | 5.5 | 18 | PI | 365 | 167 | 14 | 54 |
| Example 18 | Ag: 500 | 135 | 110 | 75 | 35 | 6.6 | 18 | PI | 365 | 167 | 14 | 54 |
| Example 19 | Sn: 50 | 125 | 105 | 135 | 72 | 5.8 | 18 | PI | 365 | 167 | 14 | 54 |
| Example 20 | Sn: 100 | 128 | 113 | 110 | 65 | 5.6 | 18 | PI | 365 | 167 | 14 | 54 |
| Example 22 | Ag: 50, Sn: 50 | 125 | 106 | 130 | 75 | 6.1 | 18 | PI | 365 | 167 | 14 | 54 |
| Example 23 | Zn: 50 | 158 | 120 | 46 | 50 | 7.5 | 18 | PI | 365 | 167 | 14 | 54 |
| Example 24 | Zn: 100 | 180 | 120 | 24 | 46 | 10.1 | 18 | PI | 365 | 167 | 14 | 54 |
| Example 26 | Ag: 50 | 101 | 96 | 135 | 70 | 4.5 | 12 | PI | 360 | 170 | 26 | 57 |
| Example 27 | Ag: 100 | 105 | 95 | 132 | 75 | 4.8 | 12 | PI | 360 | 170 | 26 | 57 |
| Example 28 | Ag: 200 | 125 | 110 | 110 | 80 | 5.8 | 12 | PI | 360 | 170 | 26 | 57 |
| Example 29 | Ag: 500 | 147 | 113 | 70 | 35 | 7.3 | 12 | PI | 360 | 170 | 26 | 57 |
| Example 30 | Sn: 50 | 110 | 105 | 130 | 63 | 4.5 | 12 | PI | 360 | 170 | 26 | 57 |

| | Copper foil composite | | | | |
|---|---|---|---|---|---|
| | Elongation (%) | W-bending | 180 degree intimate bending | Drawing formability | (F × T)/(f × t) |
| Example 1 | 52 | Excellent | Excellent | Excellent | 2.4 |
| Example 2 | 48 | Excellent | Excellent | Excellent | 2.3 |
| Example 3 | 48 | Excellent | Excellent | Excellent | 2.0 |
| Example 4 | 47 | Excellent | Excellent | Excellent | 2.1 |
| Example 5 | 53 | Excellent | Excellent | Excellent | 1.8 |
| Example 6 | 45 | Excellent | Excellent | Excellent | 1.7 |
| Example 7 | 46 | Excellent | Excellent | Excellent | 1.9 |
| Example 8 | 45 | Excellent | Excellent | Excellent | 1.8 |
| Example 9 | 43 | Excellent | Excellent | Excellent | 1.7 |
| Example 10 | 41 | Excellent | Excellent | Good | 1.8 |
| Example 12 | 37 | Excellent | Good | Good | 1.6 |
| Example 13 | 45 | Excellent | Excellent | Excellent | 1.8 |
| Example 14 | 47 | Excellent | Excellent | Excellent | 1.4 |
| Example 15 | 45 | Excellent | Excellent | Excellent | 1.3 |
| Example 16 | 45 | Excellent | Excellent | Excellent | 1.2 |
| Example 17 | 50 | Excellent | Excellent | Excellent | 1.4 |
| Example 18 | 45 | Excellent | Excellent | Excellent | 1.2 |
| Example 19 | 46 | Excellent | Excellent | Excellent | 1.2 |
| Example 20 | 46 | Excellent | Excellent | Excellent | 1.1 |
| Example 22 | 47 | Excellent | Good | Good | 1.2 |
| Example 23 | 38 | Excellent | Good | Good | 1.1 |
| Example 24 | 38 | Excellent | Good | Good | 1.1 |
| Example 26 | 53 | Excellent | Excellent | Excellent | 3.8 |
| Example 27 | 53 | Excellent | Excellent | Excellent | 3.9 |
| Example 28 | 46 | Excellent | Excellent | Excellent | 3.3 |
| Example 29 | 45 | Excellent | Excellent | Excellent | 3.3 |
| Example 30 | 45 | Excellent | Excellent | Excellent | 3.5 |

TABLE 2

| | Copper foil | | | | | | Resin layer | | | | |
|---|---|---|---|---|---|---|---|---|---|---|---|
| | Added Element (wtppm) | TS (MPa) | f (MPa) | GS (μm) | 1/10 | Elongation (%) | t (μm) | type | TS (MPa) | F (MPa) | T (μm) | Elongation (%) |
| Example 31 | Sn: 100 | 118 | 110 | 105 | 65 | 4.9 | 12 | PI | 360 | 170 | 26 | 57 |
| Example 32 | Sn: 200 | 148 | 118 | 80 | 58 | 6.5 | 12 | PI | 360 | 170 | 26 | 57 |
| Example 33 | Ag: 50, Sn: 50 | 120 | 110 | 128 | 69 | 5.1 | 12 | PI | 360 | 170 | 26 | 57 |
| Example 34 | Zn: 50 | 155 | 120 | 45 | 45 | 7.2 | 12 | PI | 360 | 170 | 26 | 57 |
| Example 35 | Zn: 100 | 172 | 125 | 20 | 40 | 8.3 | 12 | PI | 360 | 170 | 26 | 57 |
| Example 36 | Ag: 50 Zn: 50 | 122 | 108 | 55 | 55 | 5.1 | 12 | PI | 360 | 170 | 26 | 57 |
| Example 38 | Ag: 100 | 105 | 95 | 132 | 75 | 4.8 | 12 | PI | 353 | 165 | 39 | 65 |
| Example 39 | Ag: 200 | 125 | 110 | 110 | 80 | 5.8 | 12 | PI | 353 | 165 | 39 | 65 |
| Example 40 | Ag: 500 | 147 | 113 | 70 | 35 | 7.3 | 12 | PI | 353 | 165 | 39 | 65 |
| Example 41 | Sn : 50 | 110 | 105 | 130 | 63 | 4.5 | 12 | PI | 353 | 165 | 39 | 65 |
| Example 42 | Sn: 100 | 118 | 110 | 105 | 65 | 4.9 | 12 | PI | 353 | 165 | 39 | 65 |
| Example 43 | Sn: 200 | 148 | 118 | 80 | 58 | 6.5 | 12 | PI | 353 | 165 | 39 | 65 |

TABLE 2-continued

| | Added Element | TS (MPa) | f (MPa) | GS (µm) | 1/10 | Elongation (%) | t (µm) | type | TS (MPa) | F (MPa) | T (µm) | Elongation (%) |
|---|---|---|---|---|---|---|---|---|---|---|---|---|
| Example 44 | Ag: 50, Sn: 50 | 120 | 110 | 128 | 69 | 5.1 | 12 | PI | 353 | 165 | 39 | 65 |
| Example 45 | Zn: 50 | 155 | 120 | 45 | 45 | 7.2 | 12 | PI | 353 | 165 | 39 | 65 |
| Example 46 | Zn: 100 | 172 | 125 | 20 | 40 | 8.3 | 12 | PI | 353 | 165 | 39 | 65 |
| Example 47 | Ag: 50, Zn: 50 | 122 | 108 | 55 | 55 | 5.1 | 12 | PI | 353 | 165 | 39 | 65 |
| Example 48 | Ag: 50 | 135 | 112 | 143 | 70 | 6.5 | 32 | PI | 353 | 165 | 39 | 65 |
| Example 49 | Ag: 100 | 138 | 98 | 140 | 72 | 8.2 | 32 | PI | 353 | 165 | 39 | 65 |
| Example 50 | Ag: 200 | 148 | 110 | 132 | 78 | 8.1 | 32 | PI | 353 | 165 | 39 | 65 |
| Example 51 | Ag: 300 | 150 | 115 | 74 | 40 | 8.7 | 32 | PI | 353 | 165 | 39 | 65 |
| Example 52 | Sn: 50 | 140 | 112 | 125 | 60 | 6.9 | 32 | PI | 353 | 165 | 39 | 65 |
| Example 53 | Sn: 100 | 150 | 125 | 110 | 54 | 6.5 | 32 | PI | 353 | 165 | 39 | 65 |
| Example 54 | Ag: 200 | 148 | 110 | 132 | 78 | 7.9 | 32 | PI | 355 | 167 | 51 | 64 |
| Example 55 | Ag: 200 | 148 | 110 | 132 | 78 | 7.9 | 32 | PI | 350 | 167 | 15 | 55 |
| Example 56 | Zn: 100 | 172 | 125 | 20 | 40 | 8.3 | 32 | PI | 350 | 160 | 15 | 55 |
| Example 57 | Ag: 30 | 132 | 113 | 58 | 30 | 9.5 | 18 | PI | 360 | 170 | 26 | 57 |

| | Copper foil composite | | | | |
|---|---|---|---|---|---|
| | Elongation (%) | W-bending | 180 degree intimate bending | Drawing formability | (F × T)/(f × t) |
| Example 31 | 45 | Excellent | Excellent | Excellent | 3.3 |
| Example 32 | 43 | Excellent | Excellent | Excellent | 3.1 |
| Example 33 | 44 | Excellent | Excellent | Excellent | 3.3 |
| Example 34 | 40 | Excellent | Good | Good | 3.1 |
| Example 35 | 38 | Excellent | Good | Good | 2.9 |
| Example 36 | 43 | Excellent | Excellent | Excellent | 3.4 |
| Example 38 | 59 | Excellent | Excellent | Excellent | 5.6 |
| Example 39 | 51 | Excellent | Excellent | Excellent | 4.9 |
| Example 40 | 45 | Excellent | Excellent | Excellent | 4.7 |
| Example 41 | 50 | Excellent | Excellent | Excellent | 5.1 |
| Example 42 | 49 | Excellent | Excellent | Excellent | 4.9 |
| Example 43 | 45 | Excellent | Excellent | Excellent | 4.5 |
| Example 44 | 48 | Excellent | Excellent | Excellent | 4.9 |
| Example 45 | 41 | Excellent | Good | Good | 4.5 |
| Example 46 | 40 | Excellent | Good | Good | 4.3 |
| Example 47 | 50 | Excellent | Excellent | Excellent | 5.0 |
| Example 48 | 48 | Excellent | Excellent | Excellent | 1.8 |
| Example 49 | 45 | Excellent | Excellent | Excellent | 2.1 |
| Example 50 | 43 | Excellent | Excellent | Excellent | 1.8 |
| Example 51 | 44 | Excellent | Excellent | Excellent | 1.7 |
| Example 52 | 45 | Excellent | Excellent | Excellent | 1.8 |
| Example 53 | 48 | Excellent | Excellent | Excellent | 1.6 |
| Example 54 | 51 | Excellent | Excellent | Excellent | 2.4 |
| Example 55 | 35 | Excellent | Excellent | Good | 0.7 |
| Example 56 | 32 | Excellent | Good | Not Bad | 0.6 |
| Example 57 | 45 | Excellent | Excellent | Excellent | 2.2 |

TABLE 3

| | Copper foil | | | | | | | Resin layer | | | | |
|---|---|---|---|---|---|---|---|---|---|---|---|---|
| | Added Element (wtppm) | TS (MPa) | f (MPa) | GS (µm) | 1/10 | Elongation (%) | t (µm) | type | TS (MPa) | F (MPa) | T (µm) | Elongation (%) |
| Comp. Example 1 | none (tough-pitch) | 201 | 149 | 18 | 20 | 7.3 | 7 | PI | 365 | 167 | 13 | 54 |
| Comp. Example 2 | none (tough-pitch) | 210 | 143 | 20 | 20 | 9.3 | 12 | PI | 365 | 167 | 13 | 54 |
| Comp. Example 3 | none (tough-pitch) | 200 | 120 | 17 | 25 | 12.2 | 18 | PI | 365 | 167 | 13 | 54 |
| Comp. Example 4 | none (tough-pitch) | 190 | 130 | 20 | 20 | 9.3 | 12 | PI | 360 | 170 | 25 | 57 |
| Comp. Example 5 | none (tough-pitch) | 190 | 130 | 20 | 20 | 9.3 | 12 | PI | 353 | 165 | 38 | 65 |
| Comp. Example 6 | Ag: 50 | 140 | 125 | 25 | 23 | 4.8 | 12 | PI | 365 | 167 | 13 | 54 |
| Comp. Example 7 | Ag: 100 | 147 | 130 | 29 | 26 | 5.1 | 12 | PI | 365 | 167 | 13 | 54 |
| Comp. Example 8 | Sn: 100 | 138 | 120 | 35 | 25 | 4.4 | 12 | PI | 365 | 167 | 13 | 54 |
| Comp. Example 9 | electrolyte copper foil | 340 | 320 | 7 | 0.7 | 16 | 12 | PI | 365 | 167 | 13 | 54 |

TABLE 3-continued

| | Additive | | | | | | | Resin | | | | |
|---|---|---|---|---|---|---|---|---|---|---|---|---|
| Comp. Example 10 | Ag 2000 | 245 | 220 | 8 | 13 | 15 | 12 | PI | 365 | 167 | 13 | 54 |
| Comp. Example 11 | Sn 1500 | 230 | 215 | 8 | 4 | 23 | 12 | PI | 365 | 167 | 13 | 54 |
| Comp. Example 12 | Sn 20 | 131 | 128 | 120 | 25.1 | 4.8 | 9 | PI | 365 | 167 | 13 | 54 |
| Comp. Example 13 | Sn 60 | 149 | 138 | 35 | 20.1 | 5.5 | 18 | PI | 365 | 167 | 13 | 54 |
| Comp. Example 14 | none (tough-pitch) | 185 | 161 | 18 | 64.3 | 15.6 | 35 | PI | 365 | 167 | 13 | 54 |
| Comp. Example 15 | none (oxygen-free copper) | 184 | 157 | 17 | 64.1 | 15.3 | 35 | PI | 365 | 167 | 13 | 54 |
| Comp. Example 16 | none (oxygen-free copper) | 182 | 155 | 45 | 35.3 | 9.3 | 12 | PI | 365 | 167 | 13 | 54 |
| Comp. Example 17 | none (oxygen-free copper) | 181 | 162 | 70 | 94 | 16.1 | 16 | PI | 365 | 167 | 13 | 54 |
| Comp. Example 18 | Ag 1200 | 192 | 165 | 9 | 30.1 | 7.3 | 7 | PI | 365 | 167 | 13 | 54 |
| Comp. Example 19 | Ag: 100 | 152 | 132 | 29 | 27.5 | 5.1 | 12 | PI | 365 | 167 | 13 | 54 |
| Comp. Example 20 | Ag: 100 | 148 | 130 | 29 | 27.7 | 5.1 | 12 | PI | 365 | 167 | 13 | 54 |

| | Copper foil composite | | | | |
|---|---|---|---|---|---|
| | Elongation (%) | W-bending | 180 degree intimate bending | Drawing formability | $(F \times T)/(f \times t)$ |
| Comp. Example 1 | 24 | Excellent | Bad | Bad | 2.1 |
| Comp. Example 2 | 23 | Excellent | Bad | Bad | 1.3 |
| Comp. Example 3 | 22 | Excellent | Bad | Bad | 1.0 |
| Comp. Example 4 | 23 | Excellent | Bad | Bad | 2.7 |
| Comp. Example 5 | 23 | Excellent | Bad | Bad | 4.0 |
| Comp. Example 6 | 27 | Excellent | Not Bad | Bad | 1.4 |
| Comp. Example 7 | 26 | Excellent | Not Bad | Bad | 1.4 |
| Comp. Example 8 | 27 | Excellent | Not Bad | Bad | 1.5 |
| Comp. Example 9 | 18 | Bad | Bad | Bad | 0.6 |
| Comp. Example 10 | 17 | Bad | Bad | Bad | 0.8 |
| Comp. Example 11 | 18 | Bad | Bad | Bad | 0.8 |
| Comp. Example 12 | 21 | Excellent | Not Bad | Bad | 1.9 |
| Comp. Example 13 | 18 | Excellent | Bad | Bad | 0.9 |
| Comp. Example 14 | 17 | Excellent | Not Bad | Bad | 0.4 |
| Comp. Example 15 | 16 | Excellent | Not Bad | Bad | 0.4 |
| Comp. Example 16 | 20 | Excellent | Not Bad | Bad | 1.2 |
| Comp. Example 17 | 18 | Excellent | Not Bad | Bad | 0.8 |
| Comp. Example 18 | 23 | Excellent | Bad | Bad | 1.9 |
| Comp. Example 19 | 24 | Excellent | Not Bad | Bad | 1.4 |
| Comp. Example 20 | 24 | Excellent | Not Bad | Bad | 1.4 |

TABLE 4

| | Copper foil | | | | | | Resin layer | | | | |
|---|---|---|---|---|---|---|---|---|---|---|---|
| | Added Element (wtppm) | TS (MPa) | f (MPa) | GS (μm) | 1/10 | Elongation (%) | t (μm) | type | TS (MPa) | F (MPa) | T (μm) | Elongation (%) |
| Example 60 | Ag: 30 | 135 | 121 | 33 | 30 | 4.5 | 9 | PI | 365 | 167 | 14 | 54 |
| Example 61 | Ag: 200 | 133 | 123 | 53 | 32 | 4.7 | 9 | PI | 365 | 167 | 14 | 54 |
| Example 62 | Ag: 50 | 140 | 125 | 52 | 44 | 6.2 | 12 | PI | 365 | 167 | 14 | 54 |
| Example 63 | Ag: 100 | 145 | 120 | 50 | 42 | 6.7 | 12 | PI | 365 | 167 | 14 | 54 |
| Example 64 | Ag: 180 | 152 | 125 | 121 | 67 | 12.5 | 18 | PI | 365 | 167 | 14 | 54 |
| Example 65 | Ag: 130 | 153 | 121 | 125 | 65 | 13.7 | 18 | PI | 365 | 167 | 14 | 54 |
| Example 66 | Sn: 50 | 150 | 125 | 83 | 50 | 13.3 | 18 | PI | 365 | 167 | 14 | 54 |
| Example 67 | Sn: 100 | 140 | 122 | 58 | 35 | 8.2 | 12 | PI | 365 | 167 | 14 | 54 |
| Example 68 | Sn: 170 | 141 | 120 | 32 | 41 | 7.5 | 12 | PI | 365 | 167 | 14 | 54 |
| Example 69 | Ag: 50, Sn: 30 | 139 | 124 | 110 | 44 | 7.9 | 12 | PI | 365 | 167 | 14 | 54 |
| Example 70 | Zn: 100 | 138 | 122 | 38 | 49 | 6.8 | 12 | PI | 365 | 167 | 14 | 54 |
| Example 71 | Ag: 50, Zn: 50 | 133 | 120 | 60 | 42 | 7.5 | 12 | PI | 365 | 167 | 14 | 54 |

| | Copper foil composite | | | | |
|---|---|---|---|---|---|
| | Elongation (%) | W-bending | 180 degree intimate bending | Drawing formability | (F × T)/(f × t) |
| Example 60 | 38 | Excellent | Good | Good | 2.1 |
| Example 61 | 53 | Excellent | Excellent | Excellent | 2.1 |
| Example 62 | 50 | Excellent | Excellent | Excellent | 1.6 |
| Example 63 | 52 | Excellent | Excellent | Excellent | 1.6 |
| Example 64 | 48 | Excellent | Excellent | Excellent | 1.0 |
| Example 65 | 53 | Excellent | Excellent | Excellent | 1.1 |
| Example 66 | 47 | Excellent | Excellent | Excellent | 1.0 |
| Example 67 | 51 | Excellent | Excellent | Excellent | 1.6 |
| Example 68 | 39 | Excellent | Good | Good | 1.6 |
| Example 69 | 47 | Excellent | Excellent | Excellent | 1.6 |
| Example 70 | 37 | Excellent | Good | Good | 1.6 |
| Example 71 | 45 | Excellent | Excellent | Excellent | 1.6 |

As apparent from Tables 1 to 4, in each Examples, the tensile strength (TS) of the copper foil was 100 to 180 MPa, the $I200/I_0 200$ was 30 or more, the average grain size viewed from the plate surface of the copper foil was 10 to 400 μm, the formability of the copper foil composite was excellent and the bending properties and the drawing formability were also excellent.

Although the drawing formability of each of Examples 12, 23, 24, 34, 35, 45, 46, 60, 68 and 70 having the average grain size viewed from the plate surface of the copper foil being less than 50 μm was somewhat inferior as compared with other Examples, there is no practical problem. In view of this, it is desirable that the average grain size viewed from the plate surface of the copper foil is 50 to 400 μm.

In Example 55, the copper foil being identical with that in Example 54 was used but the resin layer was controlled to have (F×T)/(f×t)<1. Similarly, in Example 56, the copper foil being identical with that in Example 46 was used but the resin layer was controlled to have (F×T)/(f×t)<1. By comparing Example 55 with Example 54 and Example 56 with Example 46, it is found that the drawing formability becomes better when (F×T)/(f×t)≥1 is satisfied.

On the other hand, in each of Comparative Examples 1 to 5, it was controlled so that the temperature of the copper upon cold-rolling was at 100 to 110° C. and the rolling reduction ratio per one pass did not exceed 25% when the cold-rolling at the plate thickness of 0.1 mm or less, the average grain size viewed from the plate surface of the copper foil was 10 to 400 μm, resulting in excellent formability of the copper foil composite. However, as the tough-pitch copper (JIS-H3250 standard) containing no above-mentioned elements was used, the $I200/I_0 200$ was less than 30 and the bending properties and the drawing formability were poor. Similarly, in Comparative Example 12 where the content of the above-mentioned elements was less than 30 wt ppm, the bending properties and the drawing formability of the copper foil composite were poor.

In each of Comparative Examples 6 to 8, the copper foil was not heated at 100 to 110° C. upon the cold-rolling at the plate thickness of 0.1 mm or less, and a part of the rolling reduction ratio per one pass exceeded 25% when the cold-rolling, the $I200/I_0 200$ was less than 30 and the bending properties and the drawing formability were poor. In Comparative Example 9 using an electrolyte copper foil, the average grain size of the copper foil was less than 10 μm, the $I200/I_0 200$ was less than 30 and the bending properties and the drawing formability of the copper foil composite were poor.

In each of Comparative Examples 10, 11 and 18, the copper foil was not heated at 100 to 110° C. upon the cold-rolling at the plate thickness of 0.1 mm or less, a part of the rolling reduction ratio per one pass exceeded 25% when the cold-rolling, and the content of the above-mentioned elements exceeded 500 wt ppm, the recrystallized grains became non-uniform and the average grain size of the copper foil was less than 10 μm. Thus, the formability of the copper foil composite was poor. Furthermore, the shear band was formed upon the rolling, the {100} plane did not grow and the $I200/I_0 200$ was less than 30, thus the bending properties and the drawing properties of the copper foil composite were poor.

In Comparative Example 13, as the copper foil was not heated at 100 to 110° C. upon the cold-rolling at the plate thickness of 0.1 mm or less and a part of the rolling reduction ratio per one pass exceeded 25% upon the cold-rolling, the $I200/I_0 200$ was less than 30 and the bending properties and the drawing formability of the copper foil composite were poor.

In each of Comparative Examples 14 to 17 where at least one selected from the group consisting of Sn, Mn, Cr, Zn, Zr, Mg, Ni, Si and Ag was not added, the TS exceeded 180 MPa and the bending properties and the drawing formability of the copper foil composite were poor.

In Comparative Example 19, as the copper foil was heated at 100 to 110° C. upon the cold-rolling at the plate thickness of 0.1 mm or less but a part of the rolling reduction ratio per one pass exceeded 25% when the cold-rolling, the $I200/I_0200$ was less than 30 and the bending properties and the drawing formability of the copper foil composite were poor.

In Comparative Examples 20, as it was controlled that the rolling reduction ratio per one pass did not exceed 25% when the cold-rolling, but the copper foil was not heated at 100 to 110° C. upon the cold-rolling at the plate thickness of 0.1 mm or less, the $I200/I_0200$ was less than 30 and the bending properties and the drawing formability of the copper foil composite were poor.

What is claimed is:

1. A copper foil composite comprising a copper foil and a resin layer laminated thereto, the copper foil containing at least one element selected from the group consisting of Sn, Mn, Cr, Zn, Zr, Mg, Ni, Si and Ag at a total of 30 to 500 mass ppm, and the rest being Cu and unavoidable impurities, a tensile strength of the copper foil being 100 to 180 MPa, a degree of aggregation $I200/I0200$ of a (200) plane of the copper foil being 30 or more, and an average grain size viewed from a plate surface of the copper foil being 50 to 400 μm, and further wherein when the copper foil composite is tested for 180° intimate bending according to JIS Z 2248 and a part is bent at 180° and returned to 0° five times, the copper foil is not cracked and has no necking, or the copper foil has small wrinkles, but no large wrinkles.

2. The copper foil composite according to claim 1, wherein fracture strain of the copper foil being 5% or more, and $(F \times T)/(f \times t) \geq 1$ is satisfied, where t is a thickness of the copper foil, f is a stress of the copper foil under tensile strain of 4%, T is a thickness of the resin layer, and F is a stress of the resin layer under tensile strain of 4%.

3. A copper foil, used for the copper foil composite according to claim 1.

4. A formed product, provided by working the copper foil composite according to claim 1.

5. A method of producing a formed product, comprising working the copper foil composite according to claim 1.

* * * * *